(12) United States Patent
Sato et al.

(10) Patent No.: US 9,001,073 B2
(45) Date of Patent: Apr. 7, 2015

(54) CAPACITANCE TYPE TOUCH PANEL AND DISPLAY DEVICE

(75) Inventors: Takumi Sato, Mobara (JP); Masahiro Teramoto, Mobara (JP); Kouichi Anno, Mobara (JP)

(73) Assignee: Japan Display Inc., Tokyo (JP)

( * ) Notice: Subject to any disclaimer, the term of this patent is extended or adjusted under 35 U.S.C. 154(b) by 35 days.

(21) Appl. No.: 13/465,055

(22) Filed: May 7, 2012

(65) Prior Publication Data

US 2012/0287079 A1 Nov. 15, 2012

(30) Foreign Application Priority Data

May 10, 2011 (JP) ................................. 2011-105064

(51) Int. Cl.
*G06F 3/045* (2006.01)
*G06F 3/044* (2006.01)

(52) U.S. Cl.
CPC ......... *G06F 3/044* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,947,853 B2* | 9/2005 | Yamaoka | 702/58 |
| 7,859,039 B2* | 12/2010 | Yeh | 257/306 |
| 2007/0057344 A1* | 3/2007 | Lee | 257/532 |
| 2008/0309635 A1 | 12/2008 | Matsuo | |
| 2010/0182275 A1* | 7/2010 | Saitou | 345/174 |
| 2010/0328255 A1* | 12/2010 | Ishizaki et al. | 345/174 |
| 2010/0328562 A1* | 12/2010 | Huang | 349/38 |

FOREIGN PATENT DOCUMENTS

| | | |
|---|---|---|
| CN | 1287650 | 3/2001 |
| CN | 1576870 | 2/2005 |
| CN | 101546243 | 9/2009 |
| JP | 2008-310550 | 12/2008 |
| KR | 10-2011-0083196 | 7/2011 |

OTHER PUBLICATIONS

English translation of communication issued in connection with corresponding Chinese Patent Application No. 2012/10150250.4, mailed Oct. 10, 2014.

* cited by examiner

*Primary Examiner* — William Boddie
*Assistant Examiner* — Bipin Gyawali
(74) *Attorney, Agent, or Firm* — Lowe Hauptman & Ham, LLP

(57) ABSTRACT

Provided is a capacitance type touch panel, including: X electrodes which are arranged in parallel in a first direction; Y electrodes which are arranged in parallel in a second direction; and extraction wirings which are connected to one end portions of the Y electrodes, respectively. Each of the extraction wirings is connected to a terminal corresponding to the each of the extraction wirings, the terminal being formed at one side of the substrate. Provided that adjacent two of the Y electrodes are a first Y electrode and a second Y electrode, another end portion of the first Y electrode and another end portion of the second Y electrode have a coupling capacitance for AC-coupling the another end portion of the first Y electrode and the another end portion of the second Y electrode.

10 Claims, 7 Drawing Sheets

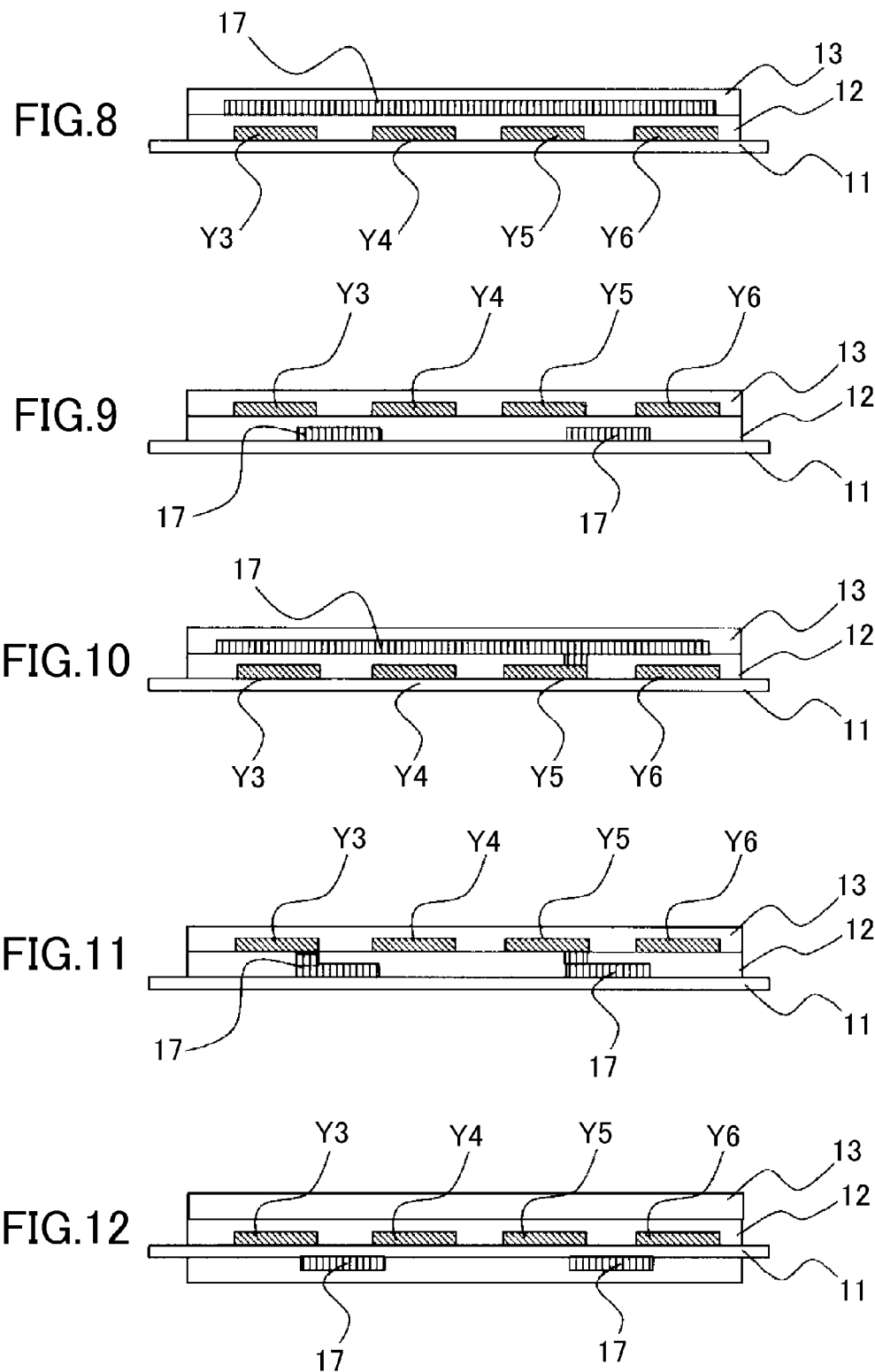

CAPACITANCE TYPE TOUCH PANEL AND DISPLAY DEVICE

CROSS-REFERENCE TO RELATED APPLICATION

The present application claims priority from Japanese application JP 2011-105064 filed on May 10, 2011, the contents of which are hereby incorporated by reference into this application.

BACKGROUND OF THE INVENTION

1. Field of the Invention

The present invention relates to a capacitance type touch panel and a display device, and more particularly, to a technology effective for detecting disconnection of an X electrode or a Y electrode.

2. Description of the Related Art

A display device which includes a device for inputting information by a touch operation (contact press operation; hereinafter, simply referred to as touch) onto a display screen with the use of a user's finger or a pen (hereinafter, the device is referred to also as touch sensor or touch panel) is used for mobile electronic devices such as a PDA and a mobile terminal, various home electric appliances, an automated teller machine, and other such devices.

As the touch panel, there are known a resistive type touch panel that detects a change in resistance at a touched portion, a capacitance type touch panel that detects a change in capacitance, and an optical sensor type touch panel that detects a change in light intensity.

One example of the capacitance type touch panel is a touch panel disclosed in Japanese Patent Application Laid-open No. 2008-310550. In the disclosed touch panel, vertical detection electrodes (hereinafter, referred to as X electrodes) and horizontal detection electrodes (hereinafter, referred to as Y electrodes) are vertically and horizontally arranged in two-dimensional matrix, and the capacitance of each electrode is detected by an input processing portion. When a conductor such as a finger contacts with the surface of the touch panel, the capacitance of each electrode increases. The input processing portion detects the increase in capacitance, and calculates input coordinates based on a signal of the capacitance change detected by each electrode.

In the capacitance type touch panel disclosed in Japanese Patent Application Laid-open No. 2008-310550, one end portion of each of the X electrodes and the Y electrodes is connected to a wiring (hereinafter, referred to as extraction wiring), and the extraction wiring is connected to a terminal connected to a flexible wiring board, thereby supplying a drive voltage from one side of the Y electrode. Hereinafter, a touch panel of this type is referred to as an end-fed type touch panel.

In the end-fed type touch panel, for example, an AC signal is applied from the Y electrode, and the AC signal is detected from each X electrode. Based on the detected AC signal, the disconnection of the X electrode, the disconnection of the Y electrode, and the short-circuit between the X electrode and the Y electrode are detected.

In the above-mentioned method, however, the discovery of a disconnection failure at the other end portion of the X electrode or the Y electrode (the end portion which is not connected to the extraction wiring) is impossible in principle.

As countermeasures for discovering a disconnection failure at the other end portion of the X electrode or the Y electrode, it is conceivable to perform a test by bringing a probe into direct contact with the other end portion of the X electrode or the Y electrode. However, there is a possibility that another failure is produced in a manufacturing line process.

SUMMARY OF THE INVENTION

The present invention has been made for solving the problem in the related art, and it is an object of the present invention to provide a technology for an end-fed capacitance type touch panel, which enables detection of a disconnection failure at the other end portion of an X electrode or a Y electrode without the need to bring a probe into direct contact with the other end portion of the X electrode or the Y electrode.

The above-mentioned and other objects and novel features of the present invention will become apparent from the following specification and the accompanying drawings.

Exemplary embodiments of the invention disclosed herein are briefly outlined as follows.

(1) A capacitance type touch panel according to an exemplary embodiment of the present invention includes: a substrate; X electrodes, which extend on the substrate in a second direction and are arranged in parallel in a first direction crossing the second direction; Y electrodes, which extend on the substrate in the first direction so as to cross each of the X electrodes and are arranged in parallel in the second direction; and extraction wirings, which are connected to one end portions of the Y electrodes, respectively, in which: each of the extraction wirings is connected to a terminal corresponding to the each of the extraction wiring, the terminal being formed at one side of the substrate; and, provided that adjacent two of the Y electrodes are a first Y electrode and a second Y electrode, another end portion of the first Y electrode and another end portion of the second Y electrode have a coupling capacitance for AC-coupling the another end portion of the first Y electrode and the another end portion of the second Y electrode. Alternatively, provided that adjacent two of the X electrodes are a first X electrode and a second X electrode, another end portion of the first X electrode and another end portion of the second X electrode have a coupling capacitance for AC-coupling the another end portion of the first X electrode and the another end portion of the second X electrode.

(2) A display device according to an exemplary embodiment of the present invention includes: a display panel; and the above-mentioned capacitance type touch panel, which is disposed on a viewer side of the display panel.

An effect obtained by the representative aspects of the invention disclosed in the subject application is briefly described as follows.

According to the end-fed capacitance type touch panel of the exemplary embodiment of the present invention, detection of a disconnection failure at the other end portion of an X electrode or a Y electrode is enabled without the need to bring a probe into direct contact with the other end portion of the X electrode or the Y electrode.

BRIEF DESCRIPTION OF THE DRAWINGS

In the accompanying drawings:

FIG. 8 is a principal part cross-sectional view illustrating the cross-sectional structure taken along the line VIII-VIII of FIG. 7;

FIG. 9 is a principal part cross-sectional view illustrating a capacitance type touch panel according to a second embodiment of the present invention, illustrating the cross-sectional structure taken along the same line as FIG. 8;

FIG. 10 is a principal part cross-sectional view illustrating a capacitance type touch panel according to a third embodiment of the present invention, illustrating the cross-sectional structure taken along the same line as FIG. 8;

FIG. 11 is a principal part cross-sectional view illustrating a capacitance type touch panel according to a fourth embodiment of the present invention, illustrating the cross-sectional structure taken along the same line as FIG. 8;

FIG. 12 is a principal part cross-sectional view illustrating a capacitance type touch panel according to a fifth embodiment of the present invention, illustrating the cross-sectional structure taken along the same line as FIG. 8;

DETAILED DESCRIPTION OF THE INVENTION

Hereinafter, embodiments of the present invention are described in detail with reference to the accompanying drawings.

Note that, throughout the drawings illustrating the embodiments, the same reference symbol is given to components having the same function, and repeated description thereof is omitted. Also note that, the following embodiments are not intended to limit the interpretation of the scope of claims of the present invention.

(Touch Panel 1 Behind the Present Invention)

Figure 1:
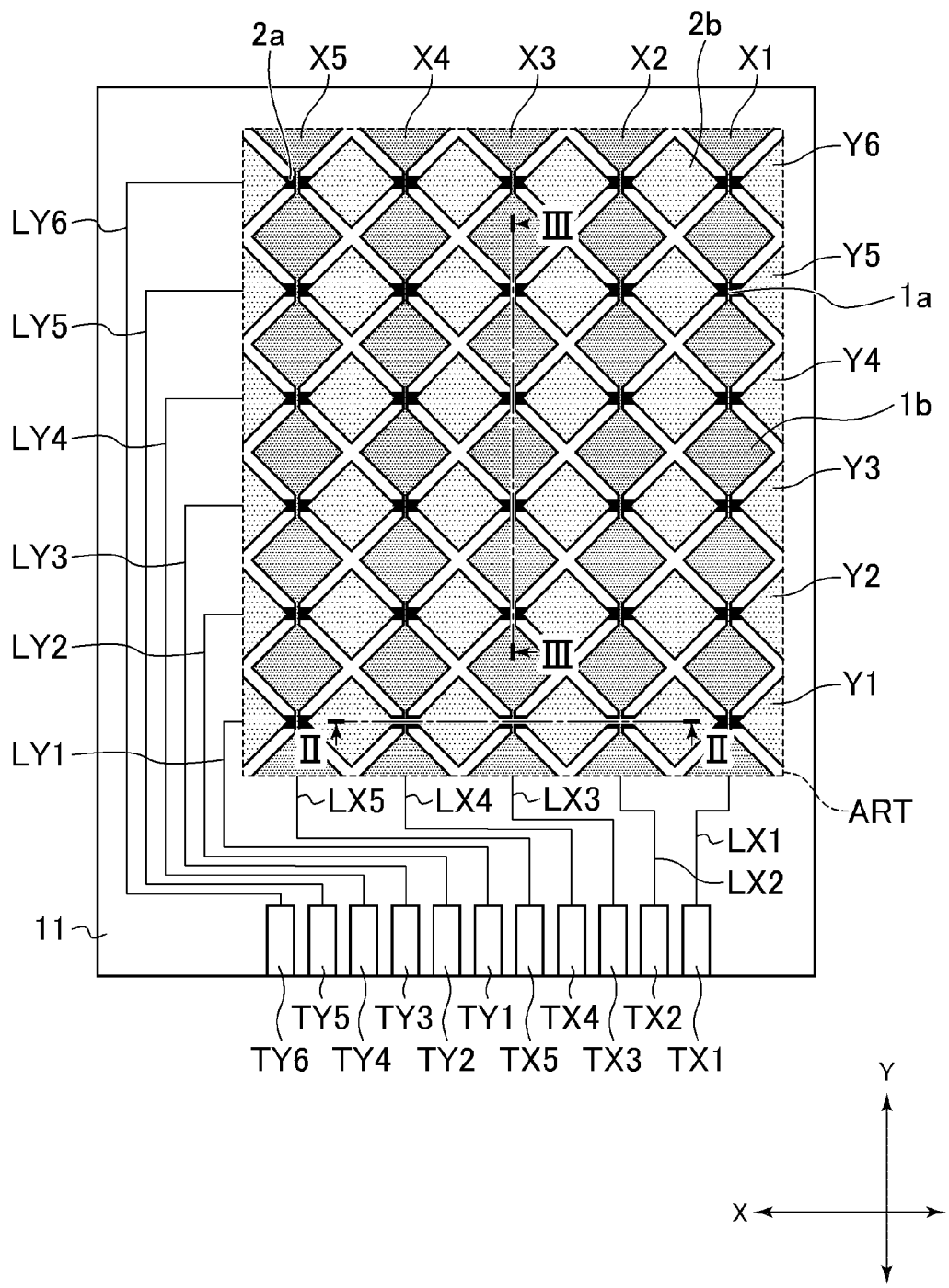
FIG. 1 is a diagram illustrating the electrode shape of a capacitance type touch panel behind the present invention.

FIG. 1 is a diagram illustrating the electrode shape of a capacitance type touch panel behind the present invention.

As illustrated in FIG. 1, the touch panel behind the present invention includes X electrodes (X1 to X5) and Y electrodes (Y1 to Y6). The X electrodes (X1 to X5) extend in a second direction (Y direction) and are arranged in parallel at a predetermined array pitch in a first direction (X direction) crossing the second direction. The Y electrodes (Y1 to Y6) extend in the first direction while crossing the X electrodes and are arranged in parallel at a predetermined array pitch in the second direction. Note that, a portion indicated by a dotted frame of FIG. 1 is an effective touch region (ART).

One end portions of the X electrodes (X1 to X5) are respectively connected to extraction wirings (LX1 to LX5), and the extraction wirings (LX1 to LX5) are respectively connected to terminals (TX1 to TX5) formed at one side of a substrate 11.

Similarly, one end portions of the Y electrodes (Y1 to Y6) are respectively connected to extraction wirings (LY1 to LY6), and the extraction wirings (LY1 to LY6) are respectively connected to terminals (TY1 to TY6) formed at the one side of the substrate 11.

Each of the X electrodes (X1 to X5) has an electrode pattern in which thin portions 1a and pad portions 1b, which have a larger width than the thin portions 1a, are disposed alternately in the second direction.

Each of the Y electrodes (Y1 to Y6) has an electrode pattern in which thin portions 2a and pad portions 2b, which have a larger width than the thin portions 2a, are disposed alternately in the first direction.

Figure 2:
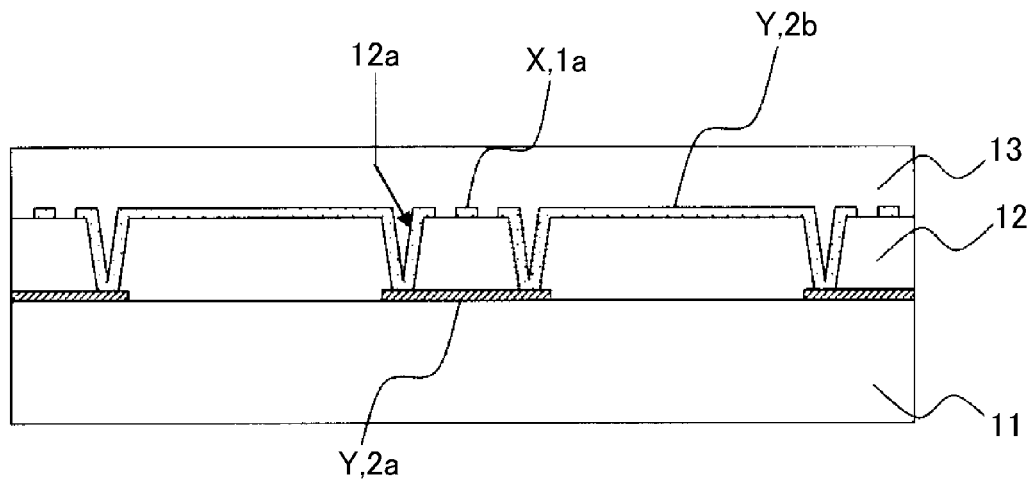
FIG. 2 is a principal part cross-sectional view illustrating the structure of a capacitance type touch panel 1 behind the present invention, illustrating the cross-sectional structure taken along the line II-II of FIG. 1.
Figure 3:
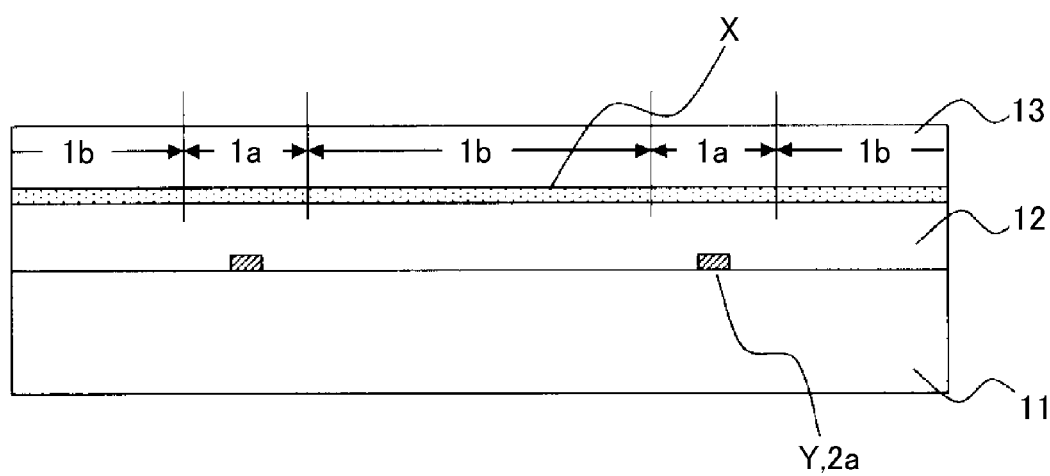
FIG. 3 is a principal part cross-sectional view illustrating the structure of the capacitance type touch panel 1 behind the present invention, illustrating the cross-sectional structure taken along the line III-III of FIG. 1.

FIGS. 2 and 3 are principal part cross-sectional views illustrating the capacitance type touch panel 1 behind the present invention.

FIG. 2 is a principal part cross-sectional view illustrating the cross-sectional structure taken along the line II-II of FIG. 1. FIG. 3 is a principal part cross-sectional view illustrating the cross-sectional structure taken along the line III-III of FIG. 1.

In the touch panel 1 behind the present invention, as illustrated in FIGS. 2 and 3, the X electrodes (X1 to X5) are disposed on an insulating film 12 and covered by a protective film 13 formed thereon.

As described above, each of the X electrodes (X1 to X5) has the electrode pattern in which the thin portions 1a and the pad portions 1b, which have a larger width than the thin portions 1a, are disposed alternately in the second direction. Further, each of the Y electrodes (Y1 to Y6) has the electrode pattern in which the thin portions 2a and the pad portions 2b, which have a larger width than the thin portions 2a, are disposed alternately in the first direction.

In plan view, the pad portion 1b of each of the X electrodes and the pad portion 2b of each of the Y electrodes are disposed so as not to overlap each other.

Further, as illustrated in FIGS. 2 and 3, the thin portion 2a of each of the Y electrodes (Y1 to Y6) is disposed on the substrate 11 and crosses the thin portion 1a of the X electrode in plan view.

The pad portion 2b of each of the Y electrodes (Y1 to Y6) is disposed on the insulating film 12 similarly to the thin portion 1a and the pad portion 1b of the X electrode, and is formed so as to be separated from the pad portion 1b of the X electrode. The pad portion 2b of each of the Y electrodes (Y1 to Y6) is covered by the protective film 13 similarly to the X electrode.

The thin portion 2a of the Y electrode, which is formed on the substrate 11, is electrically connected to two pad portions 2b, which are adjacent across the thin portion 2a, via contact holes 12a formed in the insulating film 12. Note that, as the substrate 11, for example, a transparent insulating substrate such as glass is used. The X electrodes and the Y electrodes are formed of a material having high transmission property, for example, a transparent conductive material such as indium tin oxide (ITO).

(Touch Panel 2 Behind the Present Invention)

Figure 4:
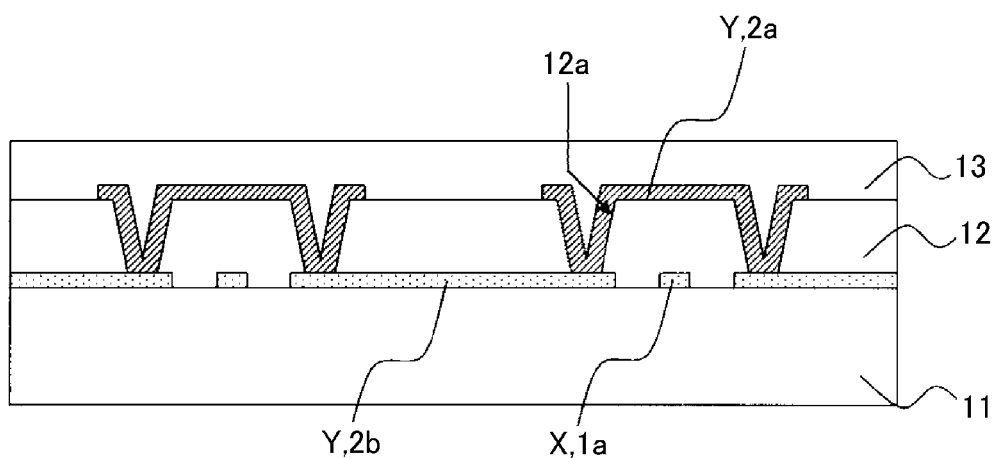
FIG. 4 is a principal part cross-sectional view illustrating the structure of a capacitance type touch panel 2 behind the present invention, illustrating the cross-sectional structure taken along the same line as FIG. 2.
Figure 5:
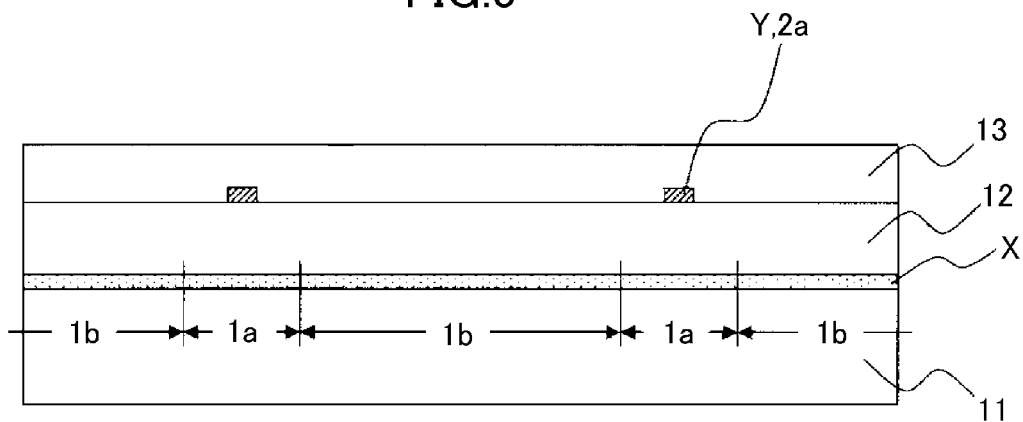
FIG. 5 is a principal part cross-sectional view illustrating the structure of the capacitance type touch panel 2 behind the present invention, illustrating the cross-sectional structure taken along the same line as FIG. 3.

FIGS. 4 and 5 are principal part cross-sectional views illustrating a capacitance type touch panel 2 behind the present invention.

FIG. 4 is a principal part cross-sectional view illustrating the cross-sectional structure taken along the same line as FIG. 2. FIG. 5 is a principal part cross-sectional view illustrating the cross-sectional structure taken along the same line as FIG. 3.

The touch panel 2 behind the present invention is different from the touch panel 1 behind the present invention in that the pad portion 2b of each of the X electrodes (X1 to X5) and the pad portion 2b of each of the Y electrodes (Y1 to Y6) are formed on the substrate 11.

In the touch panel 2 behind the present invention, as illustrated in FIGS. 4 and 5, the X electrodes (X1 to X5) are disposed on the substrate 11.

In plan view, the pad portion 1b of each of the X electrodes and the pad portion 2b of each of the Y electrodes are disposed so as not to overlap each other, and the thin portion 1a of each of the X electrodes and the thin portion 2a of each of the Y electrodes cross each other.

As illustrated in FIGS. 4 and 5, the pad portion 2b of each of the Y electrodes (Y1 to Y6) is formed on the substrate 11 so as to be separated from the pad portion 1b of the X electrode.

The thin portion 2a of each of the Y electrodes (Y1 to Y6) is disposed on the insulating film 12 and covered by the protective film 13. The thin portion 2a of the Y electrode is electrically connected to two pad portions 2b, which are adjacent across the thin portion 2a, via the contact holes 12a formed in the insulating film 12.

(Problem of the Capacitance Type Touch Panels 1 and 2 Behind the Present Invention)

In the touch panels 1 and 2 behind the present invention, for example, an AC signal is applied from the Y electrode, and the AC signal is detected from each X electrode. Based on the detected AC signal, the disconnection of the X electrodes (X1 to X5), the disconnection of the Y electrodes (Y1 to Y6), and the short-circuit between the X electrodes (X1 to X5) and the Y electrodes (Y1 to Y6) are detected.

In the above-mentioned method, however, the discovery of a disconnection failure at the other end portion of the X electrode or the Y electrode (the end portion which is not connected to the extraction wiring) is impossible in principle.

Figure 6:
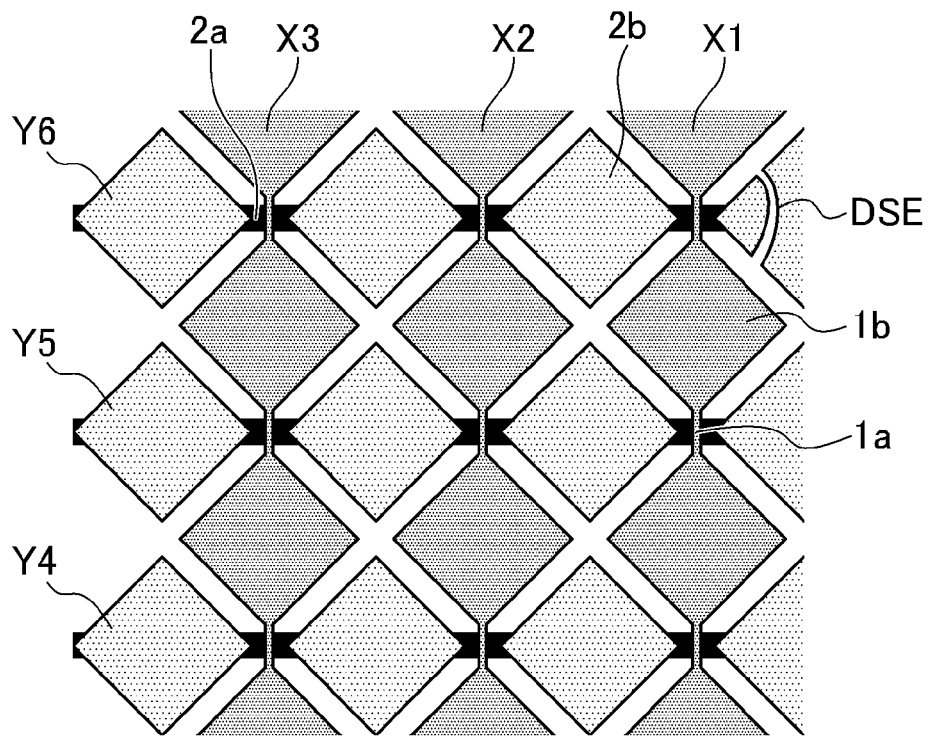
FIG. 6 is a diagram illustrating the problem of the capacitance type touch panels 1 and 2 behind the present invention.

For example, as illustrated in FIG. 6, even if the end portion of the Y electrode (Y6) has a disconnection portion (DSE), the disconnection portion (DSE) cannot be discovered by the above-mentioned method. As a result, the touch at this portion cannot be detected. The same applies to the end portion of the X electrode.

As countermeasures for discovering a disconnection failure at the other end portion of the X electrode or the Y electrode, it is conceivable to perform a test by bringing a probe into direct contact with the other end portion of the X electrode or the Y electrode. However, there is a possibility that another failure is produced in a manufacturing line process.

Note that, FIG. 6 is a diagram illustrating the problem of the capacitance type touch panels 1 and 2 behind the present invention.

First Embodiment

Figure 7:
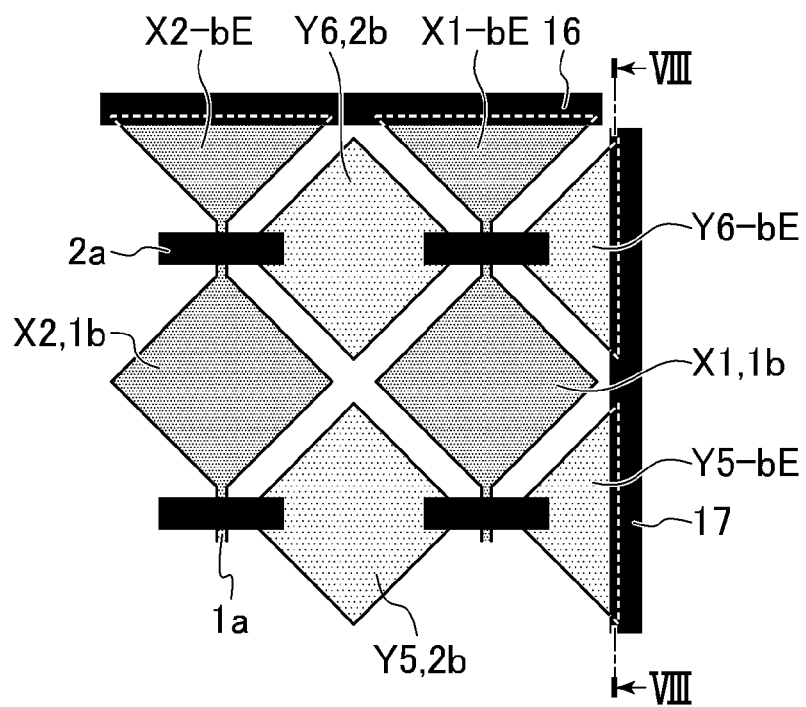
FIG. 7 is a diagram illustrating the electrode shape of a capacitance type touch panel according to a first embodiment of the present invention.

FIG. 7 is a diagram illustrating the electrode shape of a capacitance type touch panel according to a first embodiment of the present invention. Note that, FIG. 7 illustrates only a part in which the X electrodes X1 and X2 cross the Y electrodes Y6 and Y5.

FIG. 8 is a principal part cross-sectional view illustrating the cross-sectional structure taken along the line VIII-VIII of FIG. 7.

In this embodiment, there is provided a conductive layer 16 for AC-coupling the other end portions of the X electrodes (X1 to X5) (the end portions which are not connected to the extraction wirings) and a conductive layer 17 for AC-coupling the other end portions of the X electrodes (X1 to X5).

Specifically, as illustrated in FIG. 7, the conductive layer 16 overlaps a pad portion (X1-bE) of the end portion of the X electrode (X1) and a pad portion (X2-bE) of the end portion of the X electrode (X2) in a region outside the effective touch region, and the conductive layer 17 overlaps a pad portion (Y5-bE) of the end portion of the Y electrode (Y5) and the other pad portion (Y6-bE) of the Y electrode (Y6) in a region outside the effective touch region.

As illustrated in FIG. 8, the structure of the touch panel of this embodiment is the same as that of the touch panel 2 described with reference to FIGS. 4 and 5, and the conductive layer (16, 17) is formed on the insulating film 12. The conductive layer (16, 17) is formed of a metal layer or ITO, and, if formed of the same material as that of the thin portion (2a) of the Y electrode, the conductive layer (16, 17) can be produced by the same process as the thin portion (2a) of the Y electrode.

In this embodiment, an AC signal is input from the Y electrode Y6, and the AC signal is detected from the Y electrode Y5 via a coupling capacitance formed between the pad portion (Y5-bE) of the end portion of the Y electrode (Y5) and the conductive layer 17 and a coupling capacitance formed between the other pad portion (Y6-bE) of the Y electrode (Y6) and the conductive layer 17. In this manner, the disconnection at the end portion of the Y electrode (Y5), the disconnection at the end portion of the Y electrode (Y6), and the short-circuit between the end portion of the Y electrode (Y5) and the end portion of the Y electrode (Y6) can be detected.

Similarly, an AC signal is input from the X electrode X1, and the AC signal is detected from the X electrode X2 via a coupling capacitance formed between the pad portion (X1-bE) of the end portion of the X electrode (X1) and the conductive layer 16 and a coupling capacitance formed between the other pad portion (X2-bE) of the X electrode (X2) and the conductive layer 16. In this manner, the disconnection at the end portion of the X electrode (X1), the disconnection at the end portion of the X electrode (X2), and the short-circuit between the end portion of the X electrode (X1) and the end portion of the X electrode (X2) can be detected.

Note that, in the touch panel of this embodiment, during a normal touch position detection period, a drive voltage is sequentially input from the Y electrodes, and the touch position of the touch panel is detected based on signals detected at the X electrodes (X1 to X5). Therefore, even in the period for detecting the touch position, the drive voltage input from the Y electrode is also input, via the coupling capacitance formed between the pad portion of the end portion of the Y electrode and the conductive layer 17, to Y electrodes other than the Y electrode to which the drive voltage is input, and the drive voltage is then output to the X electrodes (X1 to X5). As a result, there is a possibility that the touch position of the touch panel is erroneously identified.

In light of the above, the coupling capacitance formed between the pad portion of the end portion of the Y electrode and the conductive layer 17 and the coupling capacitance formed between the pad portion of the end portion of the X electrode and the conductive layer 16 need to be set to such a value that does not cause a malfunction of the touch position detection in the normal touch position detection period.

Second Embodiment

FIG. 9 is a principal part cross-sectional view illustrating a capacitance type touch panel according to a second embodiment of the present invention. FIG. 9 illustrates a cross-sectional structure taken along the same line as FIG. 8.

As illustrated in FIG. 9, the structure of the touch panel of this embodiment is the same as that of the touch panel 2 described with reference to FIGS. 2 and 3. In this embodiment, the conductive layer 17 is formed on the substrate 11. Note that, the above-mentioned conductive layer 16 is also formed on the substrate 11.

The conductive layer (16, 17) is formed of a metal layer or ITO, and, if formed of the same material as that of the thin portion (2a) of the Y electrode, the conductive layer (16, 17) can be produced by the same process as the thin portion (2a) of the Y electrode.

Further, in this embodiment, as illustrated in FIG. 9, the conductive layer 17 does not overlap the pad portions of the end portions of all the Y electrodes, but the conductive layers 17 are provided so as to overlap the end portions of adjacent two Y electrodes every adjacent two Y electrodes.

For example, the plurality of (two in FIG. 9) conductive layers 17 are provided so as to overlap the pad portion of the end portion of the Y electrode (Y5) and the other pad portion of the Y electrode (Y6) and overlap the pad portion of the end portion of the Y electrode (Y3) and the other pad portion of the Y electrode (Y4) in a region outside the effective touch region.

Note that, although not illustrated, the conductive layer 16 on the X electrode side does not overlap the pad portions of the end portions of all the X electrodes, either, but the conductive layers 16 are provided so as to overlap the end portions of adjacent two X electrodes every adjacent two X electrodes.

Further, in this embodiment, the conductive layers 16 on the X electrode side or the conductive layers 17 on the Y electrode side may be provided every adjacent two or more X electrodes or adjacent two or more Y electrodes, instead of being provided every adjacent two X electrodes or adjacent two Y electrodes. Also in this embodiment, the same function and effect as those of the above-mentioned first embodiment can be obtained.

Third Embodiment

FIG. 10 is a principal part cross-sectional view illustrating a capacitance type touch panel according to a third embodiment of the present invention. FIG. 10 illustrates a cross-sectional structure taken along the same line as FIG. 8.

As illustrated in FIG. 10, the touch panel of this embodiment is modified from the structure of FIG. 8 so that the conductive layer 17 is electrically connected to the Y electrode Y5.

In this embodiment, an AC signal is input from the Y electrode Y6, and the AC signal is detected from the Y electrode Y5 via a coupling capacitance formed between the pad portion (Y6-bE) of the end portion of the Y electrode (Y6) and the conductive layer 17. In this manner, the disconnection at the end portion of the Y electrode (Y5), the disconnection at the end portion of the Y electrode (Y6), and the short-circuit between the end portion of the Y electrode (Y5) and the end portion of the Y electrode (Y6).

Note that, although not illustrated, the conductive layer 16 on the X electrode side is also electrically connected to an arbitrary X electrode similarly to FIG. 10.

Also in this embodiment, the same function and effect as those of the above-mentioned first embodiment can be obtained.

Fourth Embodiment

FIG. 11 is a principal part cross-sectional view illustrating a capacitance type touch panel according to a fourth embodiment of the present invention. FIG. 11 illustrates a cross-sectional structure taken along the same line as FIG. 8.

As illustrated in FIG. 11, the touch panel of this embodiment is modified from the structure of FIG. 9 so that two conductive layers 17 are electrically connected to the Y electrodes Y3 and Y5, respectively.

Note that, although not illustrated, the conductive layers 16 on the X electrode side are also electrically connected to arbitrary X electrodes similarly to FIG. 11. Also in this embodiment, the same function and effect as those of the above-mentioned first embodiment can be obtained.

Fifth Embodiment

FIG. 12 is a principal part cross-sectional view illustrating a capacitance type touch panel according to a fifth embodiment of the present invention. FIG. 12 illustrates a cross-sectional structure taken along the same line as FIG. 8.

As illustrated in FIG. 12, the touch panel of this embodiment is modified from the structure of FIG. 8 so that the conductive layers 17 are formed on the rear side of the substrate 11 so as to overlap the end portions of adjacent two Y electrodes every adjacent two Y electrodes.

Note that, although not illustrated, the conductive layers 16 on the X electrode side are also formed on the rear side of the substrate 11 so as to overlap the end portions of adjacent two X electrodes every adjacent two X electrodes similarly to FIG. 12. Also in this embodiment, the same function and effect as those of the above-mentioned first embodiment can be obtained.

Note that, in the above-mentioned first to fifth embodiments, considering the above-mentioned operation principle, the conductive layer 16 on the X electrode side and the pad portion of the end portion of the X electrode, and the conductive layer 17 on the Y electrode side and the pad portion of the end portion of the Y electrode do not always need to overlap each other in a region outside the effective touch region.

Sixth Embodiment

Figure 13:
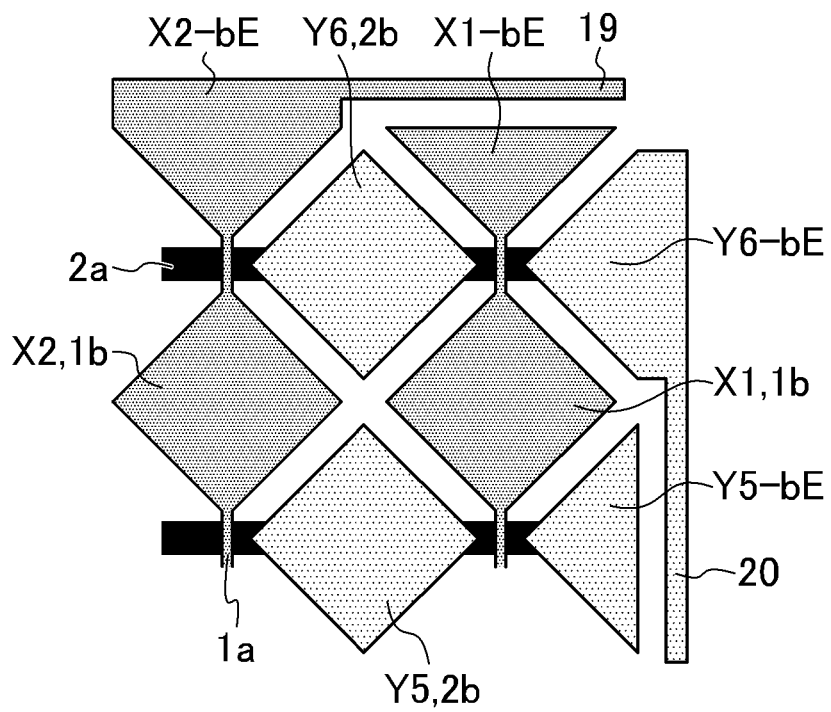
FIG. 13 is a diagram illustrating the electrode shape of a capacitance type touch panel according to a sixth embodiment of the present invention.

FIG. 13 is a diagram illustrating the electrode shape of a capacitance type touch panel according to a sixth embodiment of the present invention. Note that, FIG. 13 illustrates only a part in which the X electrodes X1 and X2 cross the Y electrodes Y6 and Y5.

As illustrated in FIG. 13, in the touch panel of this embodiment, the pad portion (X2-bE) of the end portion of the X electrode X2 is extended to form an extended pattern portion 19. A coupling capacitance is formed between the extended pattern portion 19 and the pad portion (X1-bE) of the end portion of the X electrode X1, thereby AC-coupling the pad portion (X2-bE) of the end portion of the X electrode X2 and the pad portion (X1-bE) of the end portion of the X electrode X1.

Similarly, the pad portion (Y6-bE) of the end portion of the Y electrode Y6 is extended to form an extended pattern portion 20. A coupling capacitance is formed between the extended pattern portion 20 and the pad portion (Y5-bE) of the end portion of the Y electrode Y5, thereby AC-coupling the pad portion (Y6-bE) of the end portion of the Y electrode Y6 and the pad portion (Y5-bE) of the end portion of the Y electrode Y5.

Figure 14:
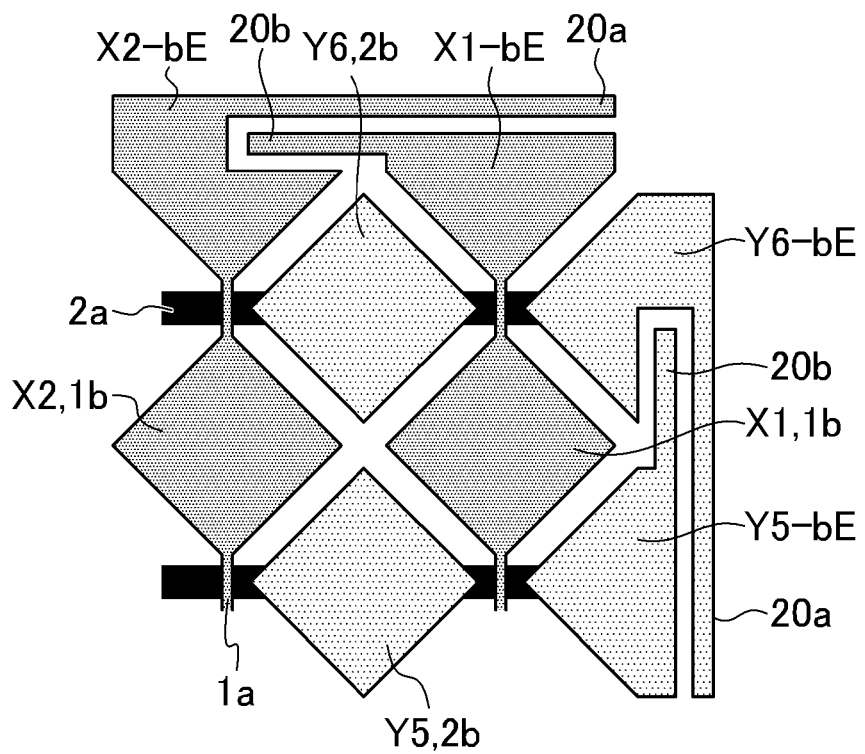
FIG. 14 is a diagram illustrating the electrode shape of a modified example of the capacitance type touch panel according to the sixth embodiment of the present invention.

FIG. 14 is a diagram illustrating the electrode shape of a modified example of the capacitance type touch panel according to the sixth embodiment of the present invention. Note that, FIG. 14 illustrates only a part in which the X electrodes X1 and X2 cross the Y electrodes Y6 and Y5.

In the touch panel illustrated in FIG. 14, the pad portion (X1-bE) of the end portion of the X electrode X1 is extended to form an extended pattern portion 19b, and the pad portion (X2-bE) of the end portion of the X electrode X2 is extended to form an extended pattern portion 19a. A coupling capacitance is formed between the extended pattern portion 19a and the pad portion (X1-bE) of the end portion of the X electrode X1, between the extended pattern portion 19b and the pad portion (X2-bE) of the end portion of the X electrode X2, and between the extended pattern portion 19a and the extended pattern portion 19b, thereby AC-coupling the pad portion (X2-bE) of the end portion of the X electrode X2 and the pad portion (X1-bE) of the end portion of the X electrode X1.

Similarly, the pad portion (Y5-bE) of the end portion of the Y electrode Y5 is extended to form an extended pattern portion 20b, and the pad portion (Y6-bE) of the end portion of the X electrode Y6 is extended to form an extended pattern portion 20a. A coupling capacitance is formed between the extended pattern portion 20a and the pad portion (Y5-bE) of the end portion of the Y electrode Y5, between the extended pattern portion 20b and the pad portion (Y6-bE) of the end portion of the Y electrode Y6, and between the extended pattern portion 20a and the extended pattern portion 20b, thereby AC-coupling the pad portion (Y6-bE) of the end portion of the Y electrode Y6 and the pad portion (Y5-bE) of the end portion of the Y electrode Y5.

Figure 15:
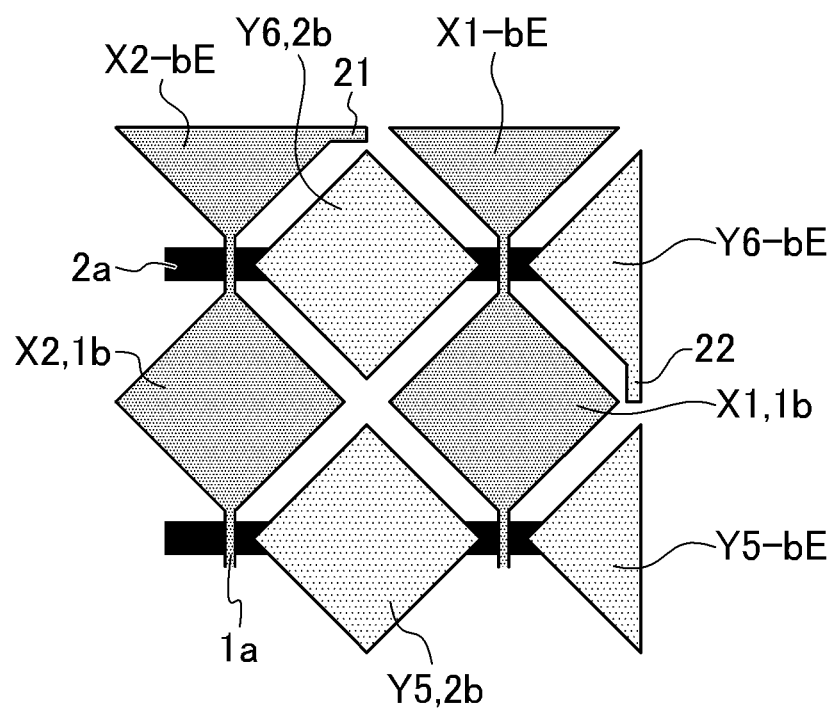
FIG. 15 is a diagram illustrating the electrode shape of another modified example of the capacitance type touch panel according to the sixth embodiment of the present invention.

FIG. 15 is a diagram illustrating the electrode shape of another modified example of the capacitance type touch panel according to the sixth embodiment of the present invention. Note that, FIG. 15 illustrates only a part in which the X electrodes X1 and X2 cross the Y electrodes Y6 and Y5.

In the touch panel illustrated in FIG. 15, an extended pattern portion 21 is formed so as to protrude from the pad portion (X2-bE) of the end portion of the X electrode X2. A coupling capacitance is formed between the extended pattern portion 21 and the pad portion (X1-bE) of the end portion of the X electrode X1, thereby AC-coupling the pad portion (X2-bE) of the end portion of the X electrode X2 and the pad portion (X1-bE) of the end portion of the X electrode X1.

Similarly, an extended pattern portion 22 is formed so as to protrude from the pad portion (Y6-bE) of the end portion of the Y electrode Y6. A coupling capacitance is formed between the extended pattern portion 22 and the pad portion (Y5-bE) of the end portion of the Y electrode Y5, thereby AC-coupling the pad portion (Y6-bE) of the end portion of the Y electrode Y6 and the pad portion (Y5-bE) of the end portion of the Y electrode Y5.

Also in this embodiment, the same function and effect as those of the above-mentioned first embodiment can be obtained.

While the invention made by the inventors of the present invention has been concretely described based on the embodiments, it should be understood that the present invention is not limited to the embodiments and various modifications may be made thereto without departing from the gist of the invention.

What is claimed is:

1. A capacitance type touch panel, comprising:
a substrate;
a plurality of X electrodes, which extends on the substrate in a second direction and is arranged in parallel in a first direction crossing the second direction;
a plurality of Y electrodes, which extends on the substrate in the first direction so as to cross each of the X electrodes and is arranged in parallel in the second direction;
extraction wirings, which are connected to one end portions of the Y electrodes, respectively; and
a detection conductive layer only provided in a region of an end portion of at least one of the X electrodes and the Y electrodes and in a region extending outside an effective touch region of the touch panel;
wherein:
each of the extraction wirings is connected to a terminal corresponding to the each of the extraction wiring, the terminal being formed at one side of the substrate;
provided that adjacent two of the Y electrodes are a first Y electrode and a second Y electrode, another end portion of the first Y electrode and another end portion of the second Y electrode have a coupling capacitance for AC-coupling at least one of the another end portion of the first Y electrode and the another end portion of the second Y electrode with the detection conductive layer;
the detection conductive layer is formed, via an insulating film, in a layer different from the another end portion of the first Y electrode and the another end portion of the second Y electrode; and
the coupling capacitance comprises at least one of a capacitance formed between the another end portion of the first Y electrode and the detection conductive layer and a capacitance formed between the another end portion of the second Y electrode and the detection conductive layer.

2. The capacitance type touch panel according to claim 1, wherein:
the detection conductive layer is connected to the another end portion of the first Y electrode; and
the coupling capacitance comprises the capacitance formed between the another end portion of the second Y electrode and the detection conductive layer.

3. The capacitance type touch panel according to claim 1, wherein, in plan view, each of the another end portion of the first Y electrode and the another end portion of the second Y electrode overlaps the detection conductive layer and the detection conductive layer extends in a region excluding the effective touch region.

4. The capacitance type touch panel according to claim 2, wherein, in plan view, each of the another end portion of the first Y electrode and the another end portion of the second Y electrode overlaps the detection conductive layer and the detection conductive layer extends in a region excluding the effective touch region.

5. A capacitance type touch panel, comprising:
a substrate;
a plurality of X electrodes, which extends on the substrate in a second direction and is arranged in parallel in a first direction crossing the second direction;
a plurality of Y electrodes, which extends on the substrate in the first direction so as to cross each of the X electrodes and is arranged in parallel in the second direction; and
extraction wirings, which are connected to one end portions of the Y electrodes, respectively; and
a detection conductive layer provided only in a region of an end portion of at least one of the X electrodes and the Y electrodes and in a region extending outside an effective touch region of the touch panel; wherein:
each of the extraction wirings is connected to a terminal corresponding to the each of the extraction wiring, the terminal being formed at one side of the substrate;
provided that adjacent two of the X electrodes are a first X electrode and a second X electrode, another end portion of the first X electrode and another end portion of the second X electrode have a coupling capacitance for AC-coupling at least one of the another end portion of the first X electrode and the another end portion of the second X electrode with the detection conductive layer;

the detection conductive layer is formed, via an insulating film, in a layer different from the another end portion of the first X electrode and the another end portion of the second X electrode; and the coupling capacitance comprises at least one of a capacitance formed between the another end portion of the first X electrode and the detection conductive layer and a capacitance formed between the another end portion of the second X electrode and the detection conductive layer.

6. The capacitance type touch panel according to claim 5, wherein:

the detection conductive layer is connected to the another end portion of the first X electrode; and the coupling capacitance comprises a capacitance formed between the another end portion of the second X electrode and the detection conductive layer.

7. The capacitance type touch panel according to claim 5, wherein, in plan view, each of the another end portion of the first X electrode and the another end portion of the second X electrode overlaps the detection conductive layer and the detection conductive layer extends in a region excluding the effective touch region.

8. The capacitance type touch panel according to claim 6, wherein, in plan view, each of the another end portion of the first X electrode and the another end portion of the second X electrode overlaps the detection conductive layer and the detection conductive layer extends in a region excluding the effective touch region.

9. A display device, comprising:

a display panel; and a touch panel, which is disposed on a viewer side of the display panel, wherein the touch panel comprises the capacitance type touch panel according to claim 1.

10. A display device, comprising:

a display panel; and a touch panel, which is disposed on a viewer side of the display panel, wherein the touch panel comprises the capacitance type touch panel according to claim 5.

* * * * *